United States Patent [19]

Arndt, deceased et al.

[11] 4,149,084

[45] Apr. 10, 1979

[54] APPARATUS FOR MAINTAINING ION BOMBARDMENT BEAM UNDER IMPROVED VACUUM CONDITION

[75] Inventors: Herbert L. Arndt, deceased, late of Wappingers Falls, N.Y.; by Margaret L. Arndt, administratrix, Catskill, N.Y.; John H. Keller, Newburgh, N.Y.; Charles M. McKenna, Fishkill, N.Y.; James R. Winnard, Poughkeepsie, N.Y.

[73] Assignee: International Business Machines Corporation, Armonk, N.Y.

[21] Appl. No.: 847,645

[22] Filed: Nov. 1, 1977

[51] Int. Cl.² ............................................. G01N 23/00
[52] U.S. Cl. .................................. 250/492 A; 250/398
[58] Field of Search ............... 250/288, 289, 398, 441, 250/440, 457, 492 A; 313/7, 360

[56] References Cited

U.S. PATENT DOCUMENTS

| | | | |
|---|---|---|---|
| 2,993,992 | 7/1961 | Craig | 250/289 |
| 3,736,425 | 5/1973 | Chernow | 250/492 A |
| 3,756,862 | 9/1973 | Ahm et al. | 148/1.5 |
| 3,983,402 | 9/1976 | Arndt et al. | 250/492 A |
| 4,011,449 | 3/1977 | Ko et al. | 250/492 A |

Primary Examiner—Bruce C. Anderson
Attorney, Agent, or Firm—James M. Thomson; J. B. Kraft

[57] ABSTRACT

In an apparatus for bombarding a target with a beam of ions, an expedient is provided for maintaining the beam line and target under vacuum of $2 \times 10^{-4}$ Torr. or lower pressures. The apparatus includes a mass separator, e.g., analyzing magnet adapted to provide selected ions which are to be formed into the desired beam with a trajectory along a selected axis: the target is positioned along this selected axis; the apparatus further includes: a housing extending from the mass separator to the target to enclose the axis and target within a chamber, beam defining means within said chamber traversing said axis and impeding the flow of gas through said chamber, said defining means having a beam defining opening therein at said axis to permit the passage of a selected portion of the beam toward the target, and vacuum drawing means connected to said chamber through an opening in said housing crossing said beam defining means whereby said drawing means removes gas from both sides of said beam defining means.

5 Claims, 1 Drawing Figure

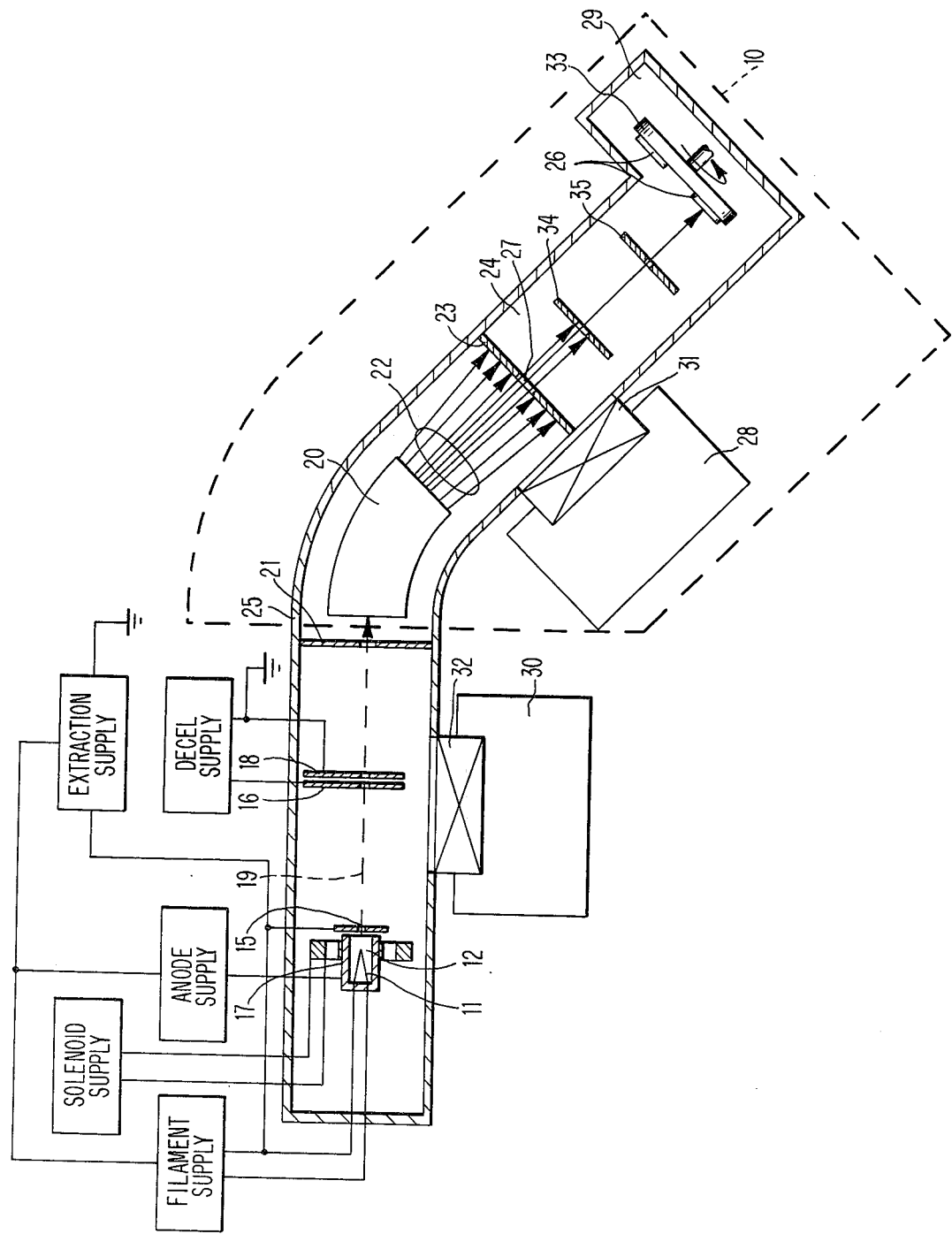

APPARATUS FOR MAINTAINING ION BOMBARDMENT BEAM UNDER IMPROVED VACUUM CONDITION

BACKGROUND OF INVENTION

The present invention relates to ion implantation or ion bombardment apparatus and more particularly to such apparatus including means for effectively retaining selected subatmospheric pressures, i.e., vacuum levels in the system. In ion implantation apparatus where wafers are being loaded into and out of target chambers positioned with respect to the beam axis, it is important that pump-down times, i.e., times necessary to restore the apparatus to its operational vacuum be as short as possible and that the pump-down be carried out as effectively as possible. In order to achieve such short pump-down times, conventional ion implantation apparatus utilizes a plurality of vacuum pumps along the beam line and target chamber. By beam line and target chamber we are referring to that portion of the ion implantation apparatus including or beyond the mass separator or analyzing magnet wherein the ions selected to bombard the target are provided with a trajectory along the beam axis. A plurality of vacuum pumps are less than completely desirable from cost, reliability and packaging viewpoints.

While it would be highly desirable to reduce the number of vacuum pumps along the beam line, present ion implantation systems have found this goal to be a problem because this portion of the apparatus utilizes beam defining structures with very small apertures, thereby severely reducing the gas conductance of this portion toward a single pump.

SUMMARY OF THE INVENTION

Accordingly, it is the primary object of the present invention to provide ion bombardment apparatus having a simplified arrangement for evacuating apparatus to vacuum pressures of $2 \times 10^{-4}$ Torr. or lower.

It is another object of the present invention to provide ion bombardment apparatus having a simplified and more efficient system of reducing and maintaining apparatus pressures to vacuum levels, i.e., $2 \times 10^{-4}$ Torr. or lower, through the use of only a single vacuum pump for the beam line and target portions of the apparatus.

It is even a further object of the present invention to provide ion bombardment apparatus with beam defining structures having minute apertures on the beam axis and high gas conductance characteristics such that vacuum levels are achieved in the beam line and target portions of the apparatus through the expedient of only a single pump.

The present invention achieves these objects by providing apparatus for bombarding a target with a beam of selected ions with a structure for maintaining a portion of said apparatus under the above vacuum conditions. This structure comprises a housing which encloses the beam axis and the target which is positioned along the beam axis within a chamber, beam defining means within said chamber traversing said axis and impeding the flow of a gas through said chamber, said defining means having a beam defining opening therein at said axis to permit the passage of a selected portion of a beam toward said target and vacuum drawing means connects to said chamber through an opening in said housing crossing said beam defining means whereby said drawing means removes gas from both sides of said beam defining means.

It should be noted that these beam defining means which impede the flow of gas through the chamber may be a separation plate traversing the chamber along the beam axis so as to separate the selected ions to permit them to pass toward the target while blocking ions with other trajectories (this will be elaborated on hereinafter), or the beam defining means which impede the flow of gas may be an expedient as simple as the beam defining plate portion of a Faraday Cage structure or any other beam current measuring structure which will impede the flow of gas through the chamber. When used in combination with the mass separator, the structure of the present invention comprises a mass separator adapted to provide said selected ions with a trajectory along a selected axis, said target being positioned along said selected axis, a housing extending from said mass separator to said target to enclose said axis and said target within a chamber, a beam defining plate within said chamber traversing said axis between said mass separator and said target, said plate having an opening therein at said axis to thereby permit an ion beam comprising selected ions to pass toward said target while blocking ions with other trajectories, and vacuum drawing means or pumping means connected to said chamber through an opening in said housing crossing said beam defining plate whereby said drawing means removes gas from both sides of said plate. With this arrangement, even if the opening in the beam defining plate is minute, the single vacuum drawing means will operate effectively in that it is connected through a housing opening which is on both sides of said beam defining plate and thereby draws from both sides of said beam defining plate independent of the opening in the beam defining plate.

While the beam defining plate could also function as the primary or even the only beam defining aperture, in conventional ion bombardment apparatus, it is advantageous to employ one or more additional beam defining aperture members between said plate and the target, to permit isolation of the target from the beam line for the purpose of target wafer loading and unloading. (See U.S. Pat. No. 3,983,402 as a typical example of such loading and unloading equipment.) Therefore, the present invention further provides for one or more of such beam defining members in a combination with a beam defining plate which will not affect the efficiency of the subatmospheric or vacuum pumping structure of the present invention. At least one annular beam defining member is positioned across the axis between the beam defining plate and the target and spaced from the housing, said member having an opening formed therein at said axis to limit said ion beam passing toward said target to selected ions in a selected shape.

The foregoing and other objects, features and advantages of the invention will be apparent from the following more particular description of the preferred embodiments of the invention as illustrated in the accompanying drawings.

BRIEF DESCRIPTION OF DRAWINGS

The FIGURE discloses a schematic representation of a conventional ion implantation apparatus modified in accordance with the present invention

DESCRIPTION OF PREFERRED invention.

Referring now to the FIGURE, as a preferred example of the structure of the present invention apparatus is described for maintaining the vacuum pressures in the beam line and target chamber portion as shown within the dashed lines 10 as it is related to a conventional ion implantation apparatus. It should be recognized that the remainder of the apparatus in the FIGURE outside of box 10 is schematic in nature and represents conventional ion implantation apparatus such as that described in U.S. Pat. No. 3,756,862. The apparatus in the FIGURE includes a conventional ion source 12 which may be any suitable high density source, although in the embodiments illustrated, a hot filament electron impact source is shown adapted to be operated in an oscillating electron discharge mode. An ion beam is extracted from the source in the conventional manner through extraction electrode 16 via aperture 15. Electrode 16 which is also known as an accel-electrode is maintained at a negative potential by the decel supply. The source electrode 17 is maintained at a positive potential with respect to filament 11 by the anode supply. A decel-electrode 18 is also provided, adapted to be maintained at ground potential. It should be recognized that the bias voltages described may be varied in the operations of the device by those skilled in the art.

The beam extracted from the ion source by the electrode arrangement disclosed is transmitted along a beam path generally indicated at 19 through apertured plate 21 to an analyzing magnet 20 of conventional design which serves as the ion separator. Apertured plate 21 traverses the beam axis 19 completely across the chamber enclosed by housing 25.

With reference to the particular aspects of the present invention, shown within block 10 of the FIGURE, the analyzing magnet 20 operates conventionally to produce a plurality of ion beams 22, each of the beams respectively having a different trajectory dependent upon respective masses of the component species of ions making up the beam which is introduced into the analyzing magnet 20 from the source. Beam defining plate 23 which traverses the whole beam line chamber 24 within housing 25 acts to block undesired species from the ion beam to be bombarded upon the target wafer 26. Aperture 27 in plate 23 serves to permit the ion with desired trajectories to pass on toward target wafer 26. With this arrangement, vacuum pump 28 acts to maintain the vacuum in both the beam line portion of the chamber 24 which extends from plate 21 to plate 23 as well as the target chamber 29. Thus, a single pump 28 is all that is necessary to maintain vacuum in the overall ion implantation equipment in addition to vacuum pump 30 which maintains the vacuum at the source end of the ion implantation equipment at the other side of plate 21. Vacuum pumps 28 and 30 respectively communicate with their respective portions of the apparatus through valves 31 and 32. In the target chamber, wafers 26 are mounted on holder 33 which is rotated and oscillated in the direction indicated by standard apparatus such as those described in U.S. Pat. Nos. 3,778,626 and 3,983,402. The wafers may be loaded and unloaded onto the wafer holder conveniently through a load-unload mechanism such as that described in U.S. Pat. No. 3,983,402. Annular beam defining members or rings 34 and 35 positioned along the axis or beam line serve to further define the species and trajectory of the beam of said selected ions into a minute dimension spot or split image suitable for application to the wafer to effect the ion bombardment or implantation processes required for integrated circuit fabrication.

Because annular beam defining members have relatively small cross-sectional dimensions and are mounted on the walls of the housing 25 by means such as brackets (not shown) which permit these members to be spaced from chamber housing 25, annular members 34 and 35 can effectively define the beam while not interfering with the flow of gas or air in the chamber during the pump-down operations by vacuum pump 28.

while the invention has been particularly shown and described with reference to the preferred embodiments thereof, it will be understood by those skilled in the art that various changes in form and details may be made therein without departing from the spirit and scope of the invention.

What is claimed is:

1. In apparatus for bombarding a target with a beam of selected ions,
    a mass separator adapted to provide said selected ions with a trajectory along a selected axis, said target being positioned along said selected axis,
    a housing extending from said mass separator to said target to enclose said axis and target within a chamber,
    a plate within said chamber traversing said axis between said mass separator and said target, said plate having an opening therein at said axis to thereby permit an ion beam comprising said selected ions to pass toward said target while blocking ions with other trajectories,
    vacuum drawing means connected to said chamber through an opening in said housing crossing said separation plate, whereby said drawing means removes gas from both sides of said plate, and
    an annular beam defining member positioned across said axis between said separation plate and target and spaced from said housing, said member having an opening formed therein at said axis to limit said ion beam passing toward said target.

2. The apparatus of claim 1 wherein said plate is impervious to gas.

3. The apparatus of claim 1 further including at least one additional annular beam defining member positioned across said axis between said separation plate and target and spaced from said housing, said member having a beam defining opening formed therein at said axis.

4. In apparatus for bombarding a target with a beam of selected ions
    a mass separator adapted to provide said selected ions with a trajectory along a selected axis, said target being positioned along said selected axis,
    a housing extending from said mass separator to said target to enclose said axis and target within a chamber
    a separation plate within said chamber traversing said axis between said mass separator and said target, said plate having an opening therein at said axis to thereby permit an ion beam comprising said selected ions to pass toward said target while blocking ions with other trajectories, and
    vacuum drawing means connected to said chamber through an opening in said housing crossing said separation plate, whereby said drawing means removes gas from both sides of said plate.

5. The apparatus of claim 4 wherein said plate is impervious to gas.

* * * * *